(12) United States Patent
Liang

(10) Patent No.: US 8,900,931 B2
(45) Date of Patent: Dec. 2, 2014

(54) IN-SITU CAVITY INTEGRATED CIRCUIT PACKAGE

(75) Inventor: Steve Xin Liang, San Diego, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 1098 days.

(21) Appl. No.: 11/964,092

(22) Filed: Dec. 26, 2007

(65) Prior Publication Data

US 2010/0283144 A1    Nov. 11, 2010

(51) Int. Cl.
| | |
|---|---|
| H01L 29/72 | (2006.01) |
| B81B 7/00 | (2006.01) |
| H01L 23/31 | (2006.01) |
| H01L 23/00 | (2006.01) |
| H03H 9/05 | (2006.01) |

(52) U.S. Cl.
CPC ............ *B81B 7/0077* (2013.01); *H01L 23/315* (2013.01); *H01L 24/81* (2013.01); *H03H 9/0523* (2013.01); *H03H 9/059* (2013.01); *B81C 2203/0109* (2013.01); *B81C 2203/019* (2013.01); *H01L 2924/01046* (2013.01); *H01L 2924/01078* (2013.01); *H01L 2924/01079* (2013.01); *H01L 2924/14* (2013.01); *H01L 2924/19041* (2013.01); *H01L 2924/19042* (2013.01); *H01L 2924/19043* (2013.01); *H01L 23/3121* (2013.01); *H01L 24/13* (2013.01); *H01L 24/16* (2013.01); *H01L 2224/1134* (2013.01); *H01L 2224/11462* (2013.01); *H01L 2224/13082* (2013.01); *H01L 2224/131* (2013.01); *H01L 2224/13144* (2013.01); *H01L 2224/13147* (2013.01); *H01L 2224/81139* (2013.01); *H01L 2224/8114* (2013.01); *H01L 2224/81191* (2013.01); *H01L 2224/81207* (2013.01); *H01L 2224/814* (2013.01); *H01L 2224/81439* (2013.01); *H01L 2224/81444* (2013.01); *H01L 2224/81447* (2013.01); *H01L 2224/81464* (2013.01); *H01L 2224/8183* (2013.01); *H01L 2924/00013* (2013.01); *H01L 2924/014* (2013.01); *B81C 2203/0118* (2013.01); *H01L 2224/16227* (2013.01); *H01L 2924/01029* (2013.01); *H01L 2224/10135* (2013.01); *H01L 2224/16225* (2013.01)
USPC .......................................... 438/126; 257/737

(58) Field of Classification Search
CPC ............................................ H01L 2924/01079
USPC .......................................... 438/126; 257/737
See application file for complete search history.

(56) References Cited

U.S. PATENT DOCUMENTS

| | | | |
|---|---|---|---|
| 5,323,051 | A | 6/1994 | Adams et al. |
| 5,448,014 | A | 9/1995 | Kong et al. |

(Continued)

FOREIGN PATENT DOCUMENTS

| | | |
|---|---|---|
| EP | 1840952 A1 | 10/2007 |
| JP | 2003-218256 A | 7/2003 |

(Continued)

OTHER PUBLICATIONS

K. C. Eun et al., "Fully Embedded LTCC Spiral Inductors Incorporating Air Cavity for High Q-factor and SRF," IEEE Electronic Components and Technology Conference, vol. 1, Jun. 1-4, 2004, pp. 1101-1103.

(Continued)

*Primary Examiner* — Edward Wojciechowicz
(74) *Attorney, Agent, or Firm* — Lando & Anastasi, LLP

(57) ABSTRACT

A flip chip semiconductor packaging device and method that incorporates in situ formation of cavities underneath selected portions of a die during a flip chip die bonding process. A method of flip chip semiconductor component packaging includes providing a die having a first surface, forming a barrier on first surface of the die, the barrier at least partially surrounding a designated location on the first surface of the die, bonding the die to a substrate in a flip chip configuration, and flowing molding compound over the die and over at least a portion of the substrate. Bonding the die to the substrate includes causing contact between the barrier and the substrate such that flow of the molding compound is blocked by the barrier to provide a cavity between the die and the substrate, the cavity being proximate the designated location on the first surface of the die.

17 Claims, 6 Drawing Sheets

(56) References Cited

U.S. PATENT DOCUMENTS

| | | | |
|---|---|---|---|
| 5,757,072 A | 5/1998 | Gorowitz et al. |
| 5,798,557 A | 8/1998 | Salatino et al. |
| 6,057,597 A | 5/2000 | Farnworth et al. |
| 6,140,144 A | 10/2000 | Najafi et al. |
| 6,207,477 B1 | 3/2001 | Motooka et al. |
| 6,214,644 B1 | 4/2001 | Glenn |
| 6,228,675 B1 | 5/2001 | Ruby et al. |
| 6,297,072 B1 | 10/2001 | Tilmans et al. |
| 6,297,551 B1 | 10/2001 | Dudderar et al. |
| 6,358,773 B1 | 3/2002 | Lin et al. |
| 6,376,280 B1 | 4/2002 | Ruby et al. |
| 6,380,616 B1 | 4/2002 | Tutsch et al. |
| 6,399,426 B1 | 6/2002 | Capote et al. |
| 6,402,970 B1 | 6/2002 | Lin |
| 6,433,277 B1 | 8/2002 | Glenn |
| 6,498,114 B1 | 12/2002 | Amundson |
| 6,504,096 B2 | 1/2003 | Okubora |
| 6,530,515 B1 | 3/2003 | Glenn et al. |
| 6,566,745 B1 | 5/2003 | Beyne et al. |
| 6,630,725 B1 | 10/2003 | Kuo et al. |
| 6,660,564 B2 | 12/2003 | Brady |
| 6,674,159 B1 | 1/2004 | Peterson et al. |
| 6,743,656 B2 | 6/2004 | Orcutt et al. |
| 6,743,991 B1 | 6/2004 | Wong et al. |
| 6,750,521 B1 | 6/2004 | Chilcott et al. |
| 6,767,764 B2 | 7/2004 | Saia et al. |
| 6,777,263 B1 | 8/2004 | Gan et al. |
| 6,787,897 B2 | 9/2004 | Geefay et al. |
| 6,794,739 B2 | 9/2004 | Kobayashi et al. |
| 6,800,508 B2 | 10/2004 | Kimura |
| 6,822,324 B2 | 11/2004 | Tao et al. |
| 6,828,674 B2 | 12/2004 | Karpman |
| 6,838,309 B1 | 1/2005 | McCann |
| 6,846,725 B2 | 1/2005 | Nagarajan et al. |
| 6,858,929 B2 | 2/2005 | Zuo et al. |
| 6,929,974 B2 | 8/2005 | Ding et al. |
| 6,939,784 B2 | 9/2005 | Chen et al. |
| 6,953,999 B2 | 10/2005 | Stranberg et al. |
| 7,030,494 B2 | 4/2006 | Aoki |
| 7,045,459 B2 | 5/2006 | Freidhoff |
| 7,045,868 B2 | 5/2006 | Ding et al. |
| 7,059,048 B2 | 6/2006 | Koning et al. |
| 7,061,099 B2 | 6/2006 | Lu et al. |
| 7,115,446 B2 * | 10/2006 | Koo et al. ............. 438/125 |
| 7,166,917 B2 | 1/2007 | Yang et al. |
| 7,169,649 B2 | 1/2007 | Rosa et al. |
| 7,198,725 B2 | 4/2007 | Shen |
| 7,202,560 B2 | 4/2007 | Dungan et al. |
| 7,203,388 B2 | 4/2007 | Ha et al. |
| 7,203,394 B2 | 4/2007 | Wiegele et al. |
| 7,265,429 B2 | 9/2007 | Wan |
| 7,268,436 B2 | 9/2007 | Aigner et al. |
| 7,275,424 B2 | 10/2007 | Felton et al. |
| 7,298,030 B2 | 11/2007 | McWilliams et al. |
| 7,311,242 B2 | 12/2007 | Six |
| 7,319,598 B2 | 1/2008 | Steiner et al. |
| 7,335,972 B2 | 2/2008 | Chanchani |
| 7,368,808 B2 | 5/2008 | Heck et al. |
| 7,456,497 B2 | 11/2008 | Higashi |
| 7,476,955 B2 * | 1/2009 | Street et al. ............. 257/434 |
| 7,576,426 B2 | 8/2009 | Gan et al. |
| 7,629,201 B2 | 12/2009 | Gan et al. |
| 7,635,606 B2 | 12/2009 | Warren et al. |
| 7,713,841 B2 | 5/2010 | Wood et al. |
| 2002/0101304 A1 | 8/2002 | Onishi et al. |
| 2002/0132463 A1 | 9/2002 | Urushima |
| 2004/0063249 A1 | 4/2004 | Lin et al. |
| 2004/0072071 A1 | 4/2004 | Watanabe et al. |
| 2004/0178492 A1 | 9/2004 | Tsukamoto et al. |
| 2004/0259325 A1 | 12/2004 | Gan |
| 2005/0054133 A1 | 3/2005 | Felton et al. |
| 2005/0139984 A1 | 6/2005 | Tuckerman et al. |
| 2006/0211233 A1 | 9/2006 | Gan et al. |
| 2006/0220173 A1 | 10/2006 | Gan et al. |
| 2007/0063129 A1 * | 3/2007 | Chen ............. 250/214.1 |
| 2007/0274058 A1 | 11/2007 | Cousin |
| 2008/0003761 A1 | 1/2008 | Gan et al. |
| 2008/0064142 A1 | 3/2008 | Gan et al. |
| 2008/0217708 A1 | 9/2008 | Reisner et al. |
| 2010/0244161 A1 | 9/2010 | Tabrizi |

FOREIGN PATENT DOCUMENTS

| | | |
|---|---|---|
| JP | 2006211612 A | 8/2006 |
| JP | 2006-237406 A | 9/2006 |
| JP | 2006-237406 A | 9/2006 |
| JP | 2006237406 * | 9/2006 |
| KR | 20030088996 | 11/2003 |
| TW | 457657 | 10/2001 |
| WO | 01/19142 A1 | 3/2001 |
| WO | 2008016436 | 2/2008 |

OTHER PUBLICATIONS

M. Franosch, "Wafer-Level-Package for Bulk Acoustic Wave (BAW) Filters," IEEE Microwaves Symposium, vol. 2, Jun. 6-11, 2004, pp. 493-496.

Young Chul Lee et al., "Monolithic LTCC SiP Transmitter for 60GHz Wireless Communication Terminals," IEEE Microwaves Symposium, Jun. 17, 2005, pp. 1015-1018.

* cited by examiner

IN-SITU CAVITY INTEGRATED CIRCUIT PACKAGE

BACKGROUND

1. Field of Invention

The present invention relates generally to semiconductor devices and methods for fabricating the same. More particularly, at least some embodiments are directed to flip chip semiconductor packages, and packaging processes, that incorporate under-die cavities.

2. Discussion of Related Art

Radio frequency integrated circuits (RFICs) are widely used in wireless devices, such as cellular telephones. RFICs combine transmission lines, matching networks, and discrete components, such as inductors, resistors, capacitors and transistors, on a substrate to provide a subsystem capable of transmitting and receiving high frequency signals, for example, in a range of about 0.1 to 100 Gigahertz (GHz). Packaging of RFICs is distinctly different from packaging of digital ICs due to the fact that the package is often part of the RF circuit, and because the complex RF electrical and/or magnetic fields of the RFIC can interact with any nearby insulators and conductors. To meet growing demands in the wireless industry, RFIC packaging development seeks to provide smaller, lower cost, higher performance devices that can accommodate multi-die RF modules while providing high reliability and using lead-free solder and other "green" materials. The single chip package, in which single- or multi-die RFICs are individually packaged, is a direct solution to the small size and low cost requirements of RFICs, and is currently used for most RFICs.

Micro electromechanical systems (MEMS) enable controlled conversions between micro-scale mechanical motion and specified electrical signals, for example, with specified frequencies. MEMS are becoming widely used in RFICs. Based on mechanical movements, RF MEMS can achieve excellent signal quality factors for RF band filters, including surface acoustic wave (SAW) filters, bulk acoustic wave (BAW) filters, and high frequency RF switches. SAW filters, for example, convert electrical signals into a mechanical wave that is delayed as it propagates across a piezoelectric crystal substrate before being converted back into an electrical signal. BAW filters use volume bulk movement to achieve a specific desired resonance, and in RF switches, electrical signals are used to control movement of a micro-electrode to turn the switch ON or OFF. Current MEMS technologies have evolved from semiconductor fabrication processing. However, the mechanical motion uniquely associated with MEMS demands very different packaging constructions and requirements from conventional semiconductor ICs. In particular, inside all MEMS ICs, some materials must move freely, without interference, and therefore, MEMS ICs must be "capped" to form a small vacuum or air cavity around the moving materials to protect them while permitting their movements.

One example of a package for an RF MEMS device, developed by Infineon Technologies, AG, uses a complex passivation structure to create an air cavity underneath a SAW/BAW filter die. A photolithographic polymer is used to generate a maze structure forming a cavity for each resonator. Reverse wire bonds are used to make the interconnections between the filter die and substrate. A silicon lid, e.g., a generally flat silicon wafer, with B-stage adhesive is attached on top of the maze structure to "cap" the ICs and complete the enclosed cavities. This package has been a relatively effective MEMS package as it uses standard die attach and wirebonding assembly technologies. However, it limits package size reduction, and the additional process steps of maze patterning and lid attachment add considerable complexity and cost to the package which reduces package efficiency and increases cost.

SUMMARY OF INVENTION

At least some aspects and embodiments are directed to a semiconductor package and packaging process that provide the under-die cavities required by MEMS devices without the complexity of conventional assembly and packaging processes. In one embodiment, a thermosonic die bonding process is used in a flip chip packaging process to bond a die to a carrier substrate, as discussed further below. The die and/or the substrate are provided with dielectric walls that, once the die is bonded to the substrate, form a barrier around a designated location, preventing molding compound from flowing into the designated location. In this manner, a cavity, or air gap, can be formed beneath a selected portion of the die, for example, beneath a MEMS device. According to at least one embodiment, cavity formation is performed in situ, occurring during the die bonding process, and does not require additional steps of complex patterning or lid-attachment, as are required by conventional packaging processes.

According to one embodiment, a method of flip chip semiconductor component packaging comprises providing a die having a first surface, forming a barrier on first surface of the die, the barrier at least partially surrounding a designated location on the first surface of the die, bonding the die to a substrate in a flip chip configuration, and flowing molding compound over the die and over at least a portion of the substrate. Bonding the die to the substrate includes causing contact between the barrier and the substrate, and flow of the molding compound is blocked by the barrier to provide a cavity between the die and the substrate, the cavity being proximate the designated location on the first surface of the die.

In one example, the method further comprises an act of bumping the die. Bumping the die may include forming gold bumps or copper pillar bumps on the first surface of the die. For gold bumps, bonding the die to the substrate may be achieved using a gold-to-gold interconnect process to form bonds between the gold bumps on the die and gold-plated conductive pads on the substrate. For copper pillar bumps, bonding the die to the substrate may include using a thermosonic bonding process to form bonds between the copper pillar bumps on the die and conductive bonding pads on the substrate. Forming the barrier may include forming a dielectric barrier such as, for example, a barrier comprising SU8 polymer.

According to another embodiment, a flip chip packaged component comprises a substrate having a first surface, the substrate comprising a plurality of conductive pads disposed on the first surface, a die having a second surface, the die comprising a plurality of bumps disposed on the second surface, each bump of the plurality of bumps being bonded to a respective one of the conductive pads, a dielectric barrier coupled between the substrate and the die, and disposed at least partially surrounding a designated location on the die to define a cavity between the die and the substrate, and molding compound covering the die and at least a portion of the die, wherein the molding compound is absent from the cavity.

The plurality of bumps may comprise, for example, a plurality of copper pillar bumps or a plurality of gold bumps. In one example, the die comprises a circuit disposed within the designated location. This die may comprise a MEMS device disposed within the designated location. In another example, the cavity is a resonant cavity. The dielectric barrier may comprise SU8 polymer. In one example, there is zero gap between the barrier and the substrate and between the barrier and the die. In another example, the barrier completely surrounds the designated location on the second surface of the die.

Another embodiment is directed to a method of flip chip semiconductor component packaging comprising providing a die having a plurality of connection bumps formed on a first surface thereof, providing a substrate having a corresponding plurality of conductive bonding pads formed on a second surface thereof, forming a dielectric barrier on the first surface of the die, the dielectric barrier at least partially surrounding a designated location on the first surface of the die, thermosonically bonding the die to the substrate, and compressing the dielectric barrier during the bonding to eliminate any gap between the barrier and the substrate and form a cavity between the die and the substrate, the cavity being defined by the barrier. Thermosonically bonding the die to the substrate may include using a gold-to-gold interconnect process to bond the plurality of connection bumps to the corresponding plurality of conductive bonding pads. Providing the die may include providing a die comprising a MEMS device, the MEMS device being at least partially disposed within the designated location on the die. In one example, forming the dielectric barrier includes forming a dielectric barrier that completely surrounds the designated location on the first surface of the die. In another example, the method further comprises an act of flowing molding compound over the die and over at least a portion of the substrate, wherein flow of the molding compound is blocked by the barrier which prevents the molding compound from entering the cavity. Forming the dielectric barrier may comprise forming a barrier made of SU8 polymer.

According to another embodiment, a method of flip chip semiconductor component packaging comprises providing a die having a plurality of connection bumps formed on a first surface thereof, providing a substrate having a corresponding plurality of conductive bonding pads formed on a second surface thereof, forming a dielectric barrier on the second surface of the substrate, thermosonically bonding the die to the substrate, and compressing the dielectric barrier during the bonding to eliminate any gap between the barrier and the die and form a cavity between the die and the substrate, the cavity being defined by the barrier. In one example, forming the dielectric barrier includes forming a barrier made of SU8 polymer. Thermosonically bonding the die to the substrate may include using a gold-to-gold interconnect process to bond the plurality of connection bumps to the corresponding plurality of conductive bonding pads. In one example, providing the die includes providing a die comprising a MEMS device, the MEMS device being at least partially disposed within the designated location on the die. In another example, forming the dielectric barrier includes forming a dielectric barrier that completely surrounds the designated location on the first surface of the die. The method may further comprise flowing molding compound over the die and over at least a portion of the substrate; wherein flow of the molding compound is blocked by the barrier which prevents the molding compound from entering the cavity.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Figure 1:
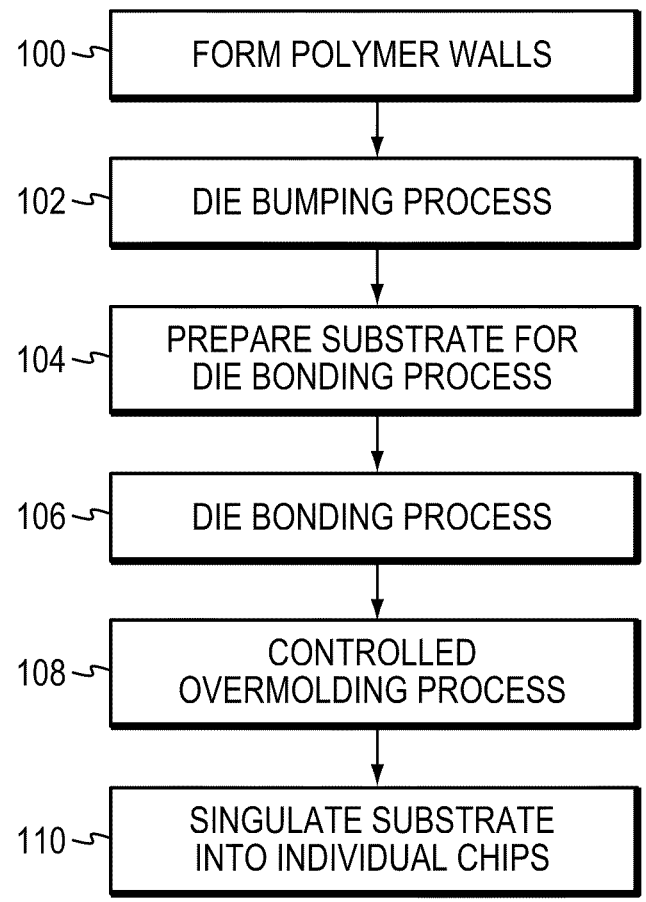
FIG. 1 is a flow diagram illustrating one example of a packaging process according to aspects of the invention.

One semiconductor packaging technique that is widely used for radio frequency integrated circuits (RFICs) is referred to as "flip chip" packaging, in which the interconnection between a die (that comprises the RF circuit) and a substrate (that provides structure support) is made through a conductive "bump" placed directly on the surface the die. The bumped die is then "flipped over" and placed face down on the substrate, with the bumps connecting the die directly to the substrate. As discussed above, flip chip RFICs, particularly those comprising MEMS devices require (or greatly benefit from) a cavity disposed between the MEMS circuit and the substrate. However, conventional techniques for providing these cavities have required complex assembly procedures, including attachment of a flat "lid" wafer to complete the cavity. By contrast, at least some aspects and embodiments are directed to a flip chip packaging method that incorporates in situ formation of cavities underneath selected portions of the die during the flip chip die bonding process.

In situ creation of cavities (e.g., air gaps) underneath dies may be accomplished though selective patterning of conductive (e.g., copper) and dielectric (e.g., solder mask and polymer) materials on the die and/or substrate and the use of a controlled overmolding process. As discussed below, according to at least one embodiment, a wall of dielectric may be provided on the die or substrate to form a barrier around a designated location when the die is bonded to the substrate. Substantially zero gap is allowed between the wall and the die/substrate, such that the wall prevents the flow of molding compound into the designated location during the overmolding process. Embodiments of the invention provide advantages of reducing or eliminating the additional process steps such as lid attachment, cap wafer bonding, etc. that are required by conventional cavity formation techniques. Thus, embodiments of the invention may facilitate simple assembly process flow and low cost packaging of RFICs, such as BAW or SAW filters, or other MEMS devices. In addition, as discussed below, a thermosonic die bonding process may used in conjunction with a low cost gold stud or copper-pillar bumping technique, further facilitating low cost packaging as well as fluxless bonding to minimize contamination.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

A flow diagram of one example of a method of packaging semiconductor devices is illustrated in FIG. 1. Aspects and embodiments of the packaging method are discussed below with continuing reference to FIG. 1.

Figure 2:
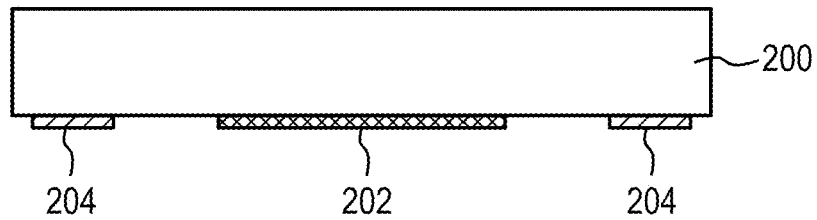
FIG. 2 is a cross-sectional diagram of one example of an RFIC die.
Figure 3:
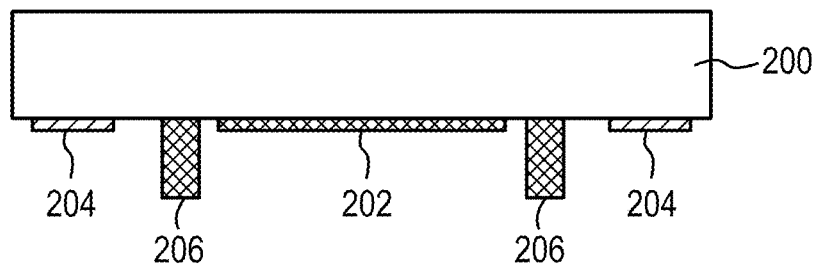
FIG. 3 is a cross-sectional diagram of a die comprising dielectric walls according to aspects of the invention.

Referring to FIG. 2, there is illustrated a cross-sectional view of one example of a die 200. The die 200 may be an RFIC, and in at least one example, includes a Micro electromechanical systems (MEMS) device, designated by circuit 202. However, the invention is not limited to MEMS devices, and the circuit 202 may comprise a circuit other than an RF circuit and other than a MEMS device. The die 200 also comprises bonding pads 204 to which bumps can be attached to allow the die 200 to be mounted flip chip to a substrate, as discussed further below.

According to one embodiment, a step 100 in the packaging method includes forming a barrier around a designated location on the die 200, for example, around the circuit 202. This barrier will provide a cavity in proximity to the circuit 202 after the die 200 is bonded to a substrate, as discussed further below. The barrier is provided by forming walls 206 on the die surrounding, or at least partially surrounding, the circuit 202. In one example, these walls 206 are formed of a polymer, such as SU8. The step 100 may comprise depositing a layer of polymer on the die and selectively removing the polymer so as to form the walls 206. Alternatively, the polymer may be selectively deposited to directly form the walls 206. Polymer deposition (and selective removal) has the advantage of being a simple manufacturing method that can be accomplished using known fabrication techniques. However, the invention is not limited to the use of polymer to form the walls 206 and other materials, such as dielectrics other than polymers, may be used instead.

Figure 4:
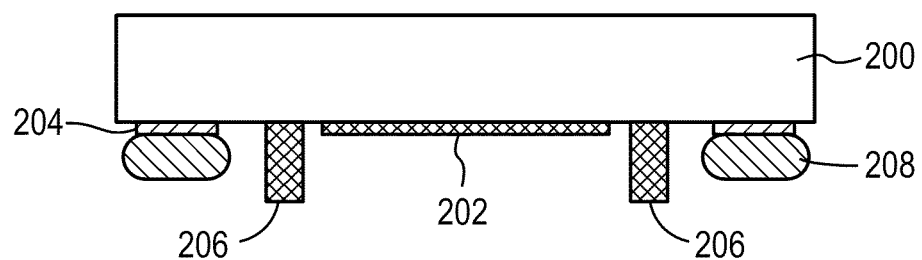
FIG. 4 is a cross-sectional diagram of the die of FIG. 3 after bumping.

As discussed above, in flip chip packaging, the die is directly bonded to a substrate via "bumps" disposed on the die. Therefore, referring again to FIG. 1, a step 102 includes a die bumping process to prepare the die 200 for bonding. A die 200 comprising bumps 208 is illustrated in FIG. 4. There are several types of bumps and bumping processes that are used for flip chip devices. One example includes forming gold bumps 208 on the die 200 by creating stud shape bumps with standard wire bonding gold wire. In another example, gold bumps may be formed by depositing a layer of gold in the desired bump locations, or by gold-plating a bonding pad 204 formed of another material (e.g., nickel). Gold bumps are favored in many applications because gold bonds have good bond strength, excellent high frequency performance and low resistance. In another example, the bumping process 102 may include forming copper pillar bumps 208 on the die 200. Copper pillar bumps comprise a copper pillar attached to the bond pad 204 and a bonding cap (not shown) disposed on top of the copper pillar. Copper pillar bumps offer advantages such as excellent electrical connections with improved thermal characteristics due to the good conductivity of copper. In addition, a copper pillar bump can be narrower than a spherical solder bump of the same height, due to the copper cylinder, and may thus facilitate a finer connection grid. To manufacture copper pillar bumps, the bumping step 100 may comprise a two stage electroplating process in which the copper pillar is electroplated onto the pad 204, and the bonding cap (which may typically comprise solder or gold) is deposited on top of the copper cylinder.

It is to be appreciated that although step 100 of forming the barrier 206 is illustrated in FIG. 1 as preceding the die bumping process 102, the invention is not so limited, and the order in which these steps are performed may be reversed. In addition, either or both steps 100 and 102 may be performed at the individual die level or at a wafer level. For example, a wafer may comprise a plurality of dies, typically many hundreds or thousands of dies. After bumping and/or formation of the barriers, the wafer may be singulated into the individual dies 200.

Figure 5:
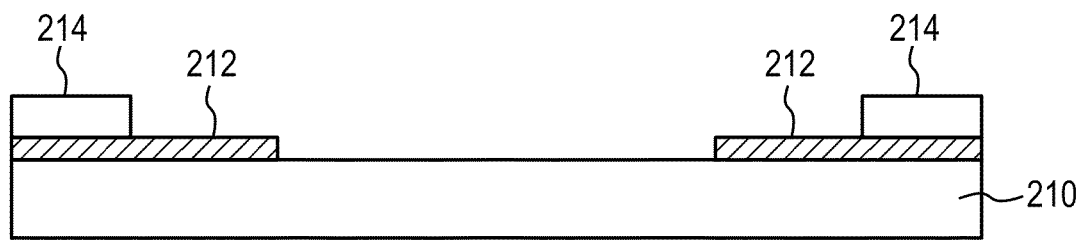
FIG. 5 is a cross-sectional diagram of one example of a conventional plated substrate.

Still referring to FIG. 1, in one embodiment, the packaging process includes a step 104 of preparing a substrate for the die bonding process 106. Referring to FIG. 5, there is illustrated an example of a substrate. The substrate 210 comprises conductive pads 212 to which the bumps of the die may be attached. A common substrate material is a printed circuit board made with organic resin. However, the substrate 210 may alternatively comprise ceramic, silicon or another insulative material. In one example, the substrate is a laminate substrate, such as FR4, with gold finishing, such that the pads 212 are formed of gold (or at least are gold-plated). Alternatively, in other examples, the pads may comprise a conductive material or metal other than gold, such as, for example, copper, silver, palladium, or solder. Prior to bonding the dies, the conductive pads 212 may be cleaned (as part of step 104), for example, using a plasma cleaning process, as known to those skilled in the art. The preparing step 104 may also include depositing a dielectric layer (such as a solder mask) 214. It is to be appreciated that although step 104 is illustrated in FIG. 1 as following steps 100 and 102, the invention is not so limited and step 104 may be performed at any time prior to bonding (i.e., step 106).

Referring again to FIG. 1, step 106 includes bonding one or more dies 200 to the substrate 210. According to one embodiment, the die bonding process 106 includes a thermosonic process in which thermal energy and mechanical pressure are applied to the die 200 to form a bond between the pads 212 on the substrate 210 and the bumps 208. As discussed above, in one example, the bumps 208 can be gold bumps. In this case, a standard gold-to-gold interconnect (GGI) bonding process can be used. GGI is a thermosonic process by which gold bumps and gold bond pads are joined together by heat and ultrasonic power under a pressure head, using a machine called a GGI bonder. The thermosonic process connection is made by solid-phase bonding between the two gold layers. Diffusion of gold (micro-welding) under load, and ultrasonic power, creates the gold-to-gold connection as a bond layer that is void-free and monolithic. GGI bonding is a relatively low cost technology, and is also a fluxless bonding method, which is environmentally friendly and minimizes contamination of the devices. The ultrasonic GGI process has a mounting accuracy of about +/−10 μm and can reliably bond dies with a thickness as thin as 100 μm. In another example, the bumps 208 may be copper pillar bumps as discussed above, and a thermosonic process may be used to bond the die 200 to the substrate 210. An example of a thermosonic bonding process that may be used is described in commonly-owned and co-pending U.S. patent application Ser. No. 11/957,730 filed Dec. 17, 2007, entitled "Thermal Mechanical Flip Chip Bonding," which is herein incorporated by reference in its entirety.

Figure 6:
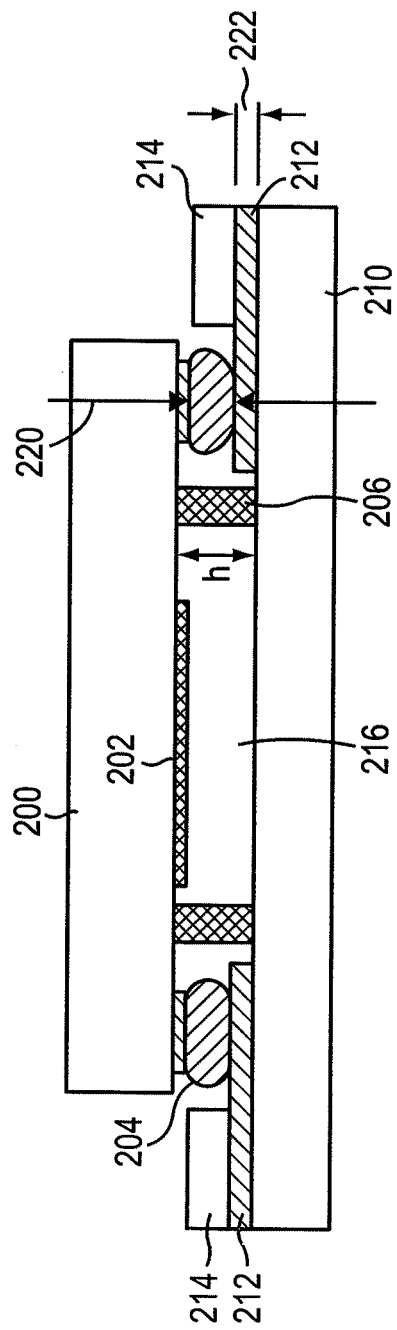
FIG. 6 is a cross-sectional diagram of the die of FIG. 4 bonded to the plated substrate of FIG. 5, according to aspects of the invention.
Figure 7:
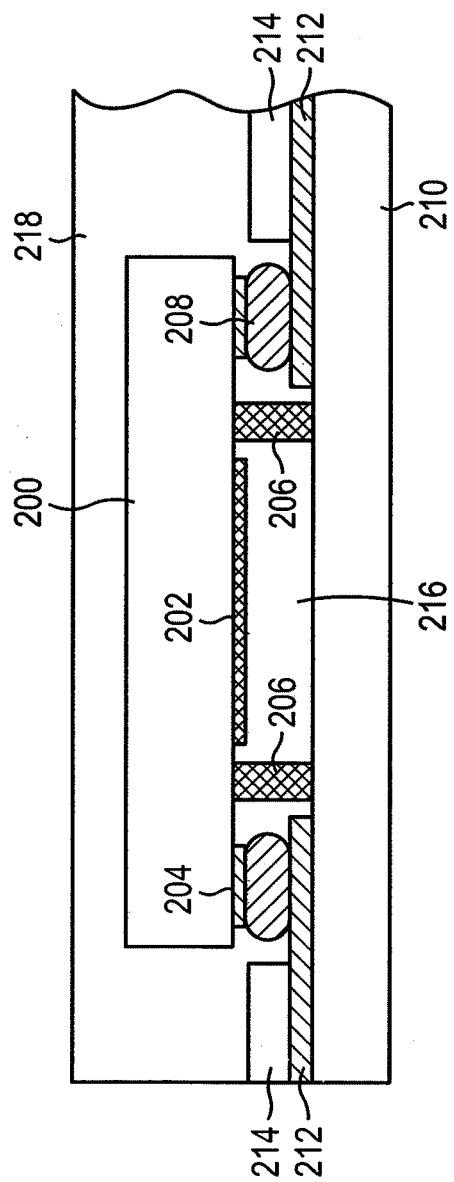
FIG. 7 is a cross-sectional diagram of a packaged device according to aspects of the invention.

Referring to FIG. 6, there is illustrated a cross-sectional view diagram of the die 200 bonded to the substrate 210. In one embodiment, the height, h, of the walls 206 is controlled such that when the die 200 is bonded to the substrate 210, the walls 206 are slightly compressed so as to leave essentially zero gap between the walls 206 and the substrate 210. The walls 206 thus form a barrier around the circuit 202 and form a cavity 216 beneath the die. This cavity (or air gap) 216 is formed in situ during the die bonding process 106, without requiring a separate "cap" to be attached to complete the cavity, as is the case with conventional cavity-forming methods. Although only left and right walls are depicted in FIG. 7, it should be appreciated that additional walls (e.g., front and back in FIG. 7) may be provided to partially or completely surround the circuit 202. It should further be appreciated that the walls may have any desired shape dictated only by the requirements of the application for which the circuit is intended. When a molding compound 218 (see FIG. 7) is applied over the die 200 and substrate 210 in a controlled overmolding process (step 108), the walls 206 prevent the molding compound 218 from entering the cavity 216, and thus maintain the cavity 216 beneath the circuit 202. It is to be appreciated that although the cavity may most commonly be filled with air, it may also be filled with another substance or a vacuum.

According to one example, the height of the walls 206 is selected based at least in part on the material that the walls 206 are made of (i.e., a compressibility of the walls), a known height 222 of the bonding pads 212, a stand-off 220 of the bumps 208, and the pressure to be exerted during thermosonic bonding of the die 200 to the substrate 210. In one example, the height 222 of the conductive bond pads 212 is about 27 micrometers (μm), and the bump stand-off 220 is in a range of about 10-20 μm. The bump stand-off may decrease during bonding of the die 200 to the substrate 210. Therefore, in one example, the height, h, of the walls 206 is about 40 μm, such that after bonding, there is essentially zero gap between the walls 206 and the substrate 210. It is to be appreciated that the dimensions given herein are examples only, and not intended to be limiting. The dimensions of the walls 206, conductive pad 212 and bump stand-off 220 may vary depending on the application, materials used and die bonding process used.

As discussed above, in at least some embodiments, the walls 206 are formed on the die 200 prior to bonding of the die 200 to the substrate 210. Alternatively, however, the walls 206 may be formed on the substrate 210 prior to bonding of the die 200 to the substrate 210. The walls 206 may be formed on the substrate 210 through controlled patterning of the substrate and using conventional dielectric deposition processes, and optional selective removal processes, as discussed above. In this example, the stand-off (i.e., height) of the walls 206 and bumps 208 can be controlled so as to provide essentially zero gap between the top of the walls and the die 200 when the die 200 is bonded to the substrate 210.

Figure 8:
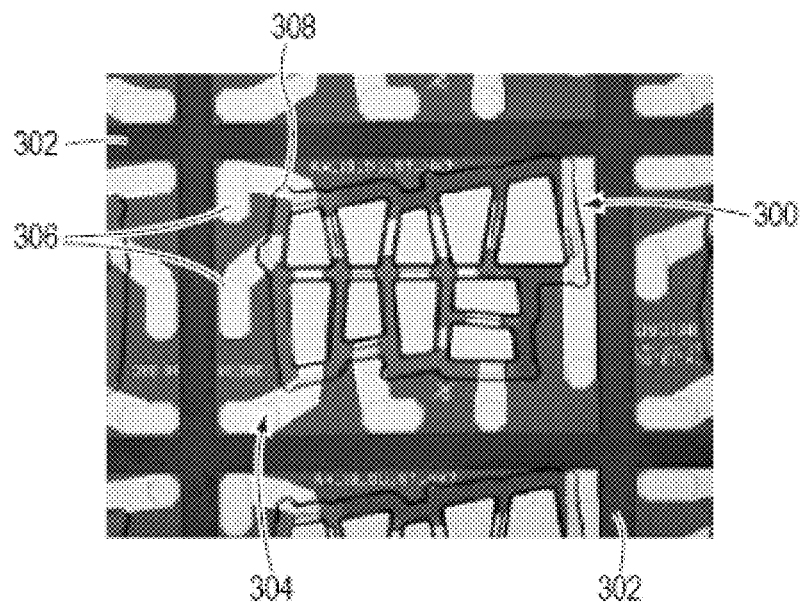
FIG. 8 is an image of a portion of a semiconductor substrate having a BAW filter formed thereon, according to aspects of the invention.
Figure 9:
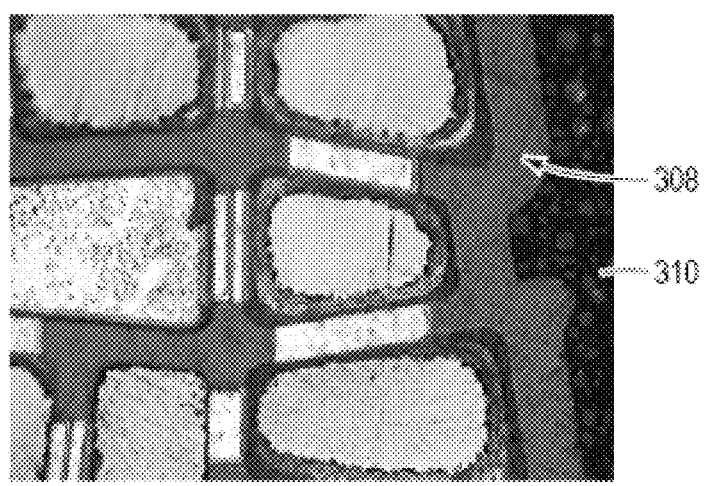
FIG. 9 is an enlarged image of a portion of the BAW filter of FIG. 8, illustrating the dielectric walls blocking molding compound from entering the cavity.

Some examples of packaged BAW filters were produced using an embodiment of the packaging method discussed herein. A top surface image of a portion of a substrate comprising an example BAW filter 300 is illustrated in FIG. 8. The BAW filters 300 are separated from one another on the substrate by "streets" 302 that were formed using conventional methods. The BAW filter comprises several conductive connection points 304 that allow signals to be provided to and from the BAW filter 300. The barrier 308 formed by the dielectric walls 206 (see FIG. 6) is clearly visible surrounding the BAW filter die. In this example, the barrier 308 comprises SU8 polymer. Molding compound was applied over the BAW filters using a controlled overmolding process. The barrier 308 prevents the molding compound flow at designated locations to create unfilled air gaps underneath the BAW filter dies. Blocking of the molding compound 310 by the barrier 308 can be seen in FIG. 9 which is an enlarged image of a portion of the BAW filter 300. After the overmolding process, the substrate may be singulated, along the streets 302, to form individual packaged components (step 110 in FIG. 1).

To test the robustness of components formed using the flip chip packaging method of embodiments of the invention, several example BAW filter components were produced and subjected to "shear" tests. In these tests, shear force is exerted upon the component, with the force being continuously (or incrementally) increased until the die is sheared off from the substrate. This test provides data regarding the strength or mechanical integrity of the bond between the bumps 208 and the die 200 and between the bumps 208 and the substrate pads 212. Table 1 below contains test result data for eleven examples of BAW filters manufactured according to an embodiment of the packaging process discussed herein. In each of the examples, the dies comprised gold bumps 208 and were bonded to the substrates using a GGI bonding process. The GGI bonding machine was programmed to apply bond force of 5 Newtons, and to apply 1.5 Watts of ultrasonic power for 0.3 seconds during the GGI bonding process.

TABLE 1

Die shear data for examples of BAW filter packages

| Example No. | Bump transfer* | Bump height (μm) | Die shear force (Kgf) |
| --- | --- | --- | --- |
| 1 | 6 | 20.3 | 261.50 |
| 2 | 5 | 21.9 | 331.80 |
| 3 | 4 | 19.5 | 227.90 |
| 4 | 5 | 20.9 | 202.80 |
| 5 | 5 | 22.0 | 254.60 |
| 6 | 5 | 22.5 | 255.40 |
| 7 | 4 | 21.8 | 241.40 |
| 8 | 6 | 24.3 | 248.20 |
| 9 | 4 | 23.8 | 244.00 |
| 10 | 6 | 23.4 | 210.20 |
| 11 | 6 | 20.8 | 219.40 |

TABLE 1-continued

Die shear data for examples of BAW filter packages

| Example No. | Bump transfer* | Bump height (μm) | Die shear force (Kgf) |
|---|---|---|---|
| Minimum | 4.00 | 19.5 | 202.80 |
| Maximum | 6.00 | 24.3 | 331.80 |
| Average | 5.09 | 21.93 | 245.17 |
| Standard deviation | 0.83 | 1.5 | 34.60 |

*"Bump transfer" refers to the number of bumps that shear off from the die under the die shear force listed in column 4, suggesting good bonding between bumps and substrate pads.

The data in Table 1 indicates that components packaged according to examples of the packaging method discussed herein demonstrate good joint strength and reliability. The presence of the in situ cavity, and lack of molding compound in the cavity area, does not adversely affect the mechanical reliability of the component. Thus, aspects and embodiments provide a robust, reliable packaged component, such as an RFIC (particularly a MEMS device), that incorporates in situ formation of an under-die cavity in a simple, clean and low cost packaging method.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of flip chip semiconductor component packaging, the method comprising:
    providing a die having a first surface;
    forming a dielectric barrier on the first surface of the die, the dielectric barrier at least partially surrounding a designated location on the first surface of the die;
    forming a plurality of bumps on the first surface of the die, the plurality of bumps being located on an opposite side of the dielectric barrier from the designated location;
    bonding the die to a substrate in a flip chip configuration, the substrate including a plurality of bonding pads on a second surface of the substrate, and bonding the die to the substrate is achieved by connecting the plurality of bumps to the plurality of bonding pads, the bonding causing contact between the dielectric barrier and the substrate to provide a cavity defined by the first surface of the die, the dielectric barrier and the substrate, the cavity being proximate the designated location on the first surface of the die; and
    overmolding the die and at least a portion of the substrate using a molding compound to create the flip chip semiconductor component packaging that encapsulates the die and the portion of the substrate, the molding compound thereby also underfilling a portion of the die, flow of the molding compound being blocked by the dielectric barrier which prevents the molding compound from entering the cavity.

2. The method as claimed in claim 1 wherein forming the plurality of bumps includes forming bumps that are made of a conductive material.

3. The method as claimed in claim 2 wherein forming the plurality of bumps includes forming gold bumps on the first surface of the die.

4. The method as claimed in claim 3 wherein the plurality of bonding pads are gold-plated bonding pads, and wherein bonding the die to the substrate includes using a gold-to-gold interconnect process to form bonds between the gold bumps on the die and the goldplated bonding pads on the substrate.

5. The method as claimed in claim 2 wherein forming the plurality of bumps comprises forming copper pillar bumps on the first surface of the die.

6. The method as claimed in claim 5 wherein the plurality of bonding pads are conductive bonding pads, and wherein bonding the die to the substrate includes using a thermosonic bonding process to form bonds between the copper pillar bumps on the die and the conductive bonding pads on the substrate.

7. The method as claimed in claim 1 wherein forming the dielectric barrier includes forming a barrier comprising SU8 polymer.

8. A method of flip chip semiconductor component packaging, the method comprising:
    providing a die having a plurality of connection bumps formed on a first surface thereof;
    providing a substrate having a corresponding plurality of conductive bonding pads formed on a second surface thereof;
    forming a dielectric barrier on the first surface of the die, the dielectric barrier at least partially surrounding a designated location on the first surface of the die, the designated location being free of any of the plurality of connection bumps;
    thermosonically bonding the plurality of connection bumps on the first surface of the die to the plurality of conductive bonding pads on the second surface of the substrate;
    compressing the dielectric barrier during the bonding to eliminate any gap between the barrier and the substrate and form a cavity between the first surface of the die and the substrate, the cavity being defined by the barrier; and
    overmolding the die and at least a portion of the substrate using a molding compound to create the flip chip semiconductor component packaging that encapsulates the die and the portion of the substrate, the molding compound thereby also underfilling a portion of the die, flow of the molding compound being blocked by the bather which prevents the molding compound from entering the cavity.

9. The method as claimed in claim 8 wherein thermosonically bonding the die to the substrate includes using a gold-to-gold interconnect process to bond the plurality of connection bumps to the corresponding plurality of conductive bonding pads.

10. The method as claimed in claim 8 wherein providing the die includes providing a die comprising a MEMS device, the MEMS device being at least partially disposed within the designated location on the die.

11. The method as claimed in claim 8 wherein forming the dielectric barrier includes forming a dielectric barrier that completely surrounds the designated location on the first surface of the die.

12. The method as claimed in claim 8 wherein forming the dielectric barrier comprises forming a barrier made of SU8 polymer.

13. A method of flip chip semiconductor component packaging, the method comprising:
    providing a die having a plurality of connection bumps formed on a first surface thereof;

providing a substrate having a corresponding plurality of conductive bonding pads formed on a second surface thereof;

forming a dielectric barrier on the second surface of the substrate;

thermosonically bonding the plurality of connection bumps on the first surface of the die to the plurality of conductive bonding pads on the second surface of the substrate;

compressing the dielectric bather during the bonding to eliminate any gap between the barrier and the first surface of the die and form a cavity between the first surface of the die and the substrate, the cavity being defined by the barrier; and overmolding the die and at least a portion of the substrate using a molding compound to create the flip chip semiconductor component packaging that encapsulates the die and the portion of the substrate, the molding compound thereby also underfilling a portion of the die, flow of the molding compound being blocked by the barrier which prevents the molding compound from entering the cavity.

14. The method as claimed in claim 13 wherein forming the dielectric barrier includes forming a barrier made of SU8 polymer.

15. The method as claimed in claim 13 wherein thermosonically bonding the die to the substrate includes using a gold-to-gold interconnect process to bond the plurality of connection bumps to the corresponding plurality of conductive bonding pads.

16. The method as claimed in claim 13 wherein providing the die includes providing a die comprising a MEMS device.

17. The method as claimed in claim 13 wherein forming the dielectric barrier includes forming a dielectric barrier that completely surrounds a designated location on the first surface of the die, the designated location on the first surface of the die being free of any of the plurality of connection bumps.

* * * * *

UNITED STATES PATENT AND TRADEMARK OFFICE
CERTIFICATE OF CORRECTION

PATENT NO. : 8,900,931 B2
APPLICATION NO. : 11/964092
DATED : December 2, 2014
INVENTOR(S) : Steve X. Liang It is certified that error appears in the above-identified patent and that said Letters Patent is hereby corrected as shown below:

In the Specification:

Column 5, Line 58, delete "SUB" and insert -- SU8 --.

In the Claims:

Column 10, Line 45, Claim 8, delete "bather" and insert -- barrier --.

Column 11, Line 10, Claim 13, delete "bather" and insert -- barrier --.

Signed and Sealed this
Sixteenth Day of June, 2015

Michelle K. Lee
*Director of the United States Patent and Trademark Office*